United States Patent
Bettinelli

(10) Patent No.: US 7,492,040 B2
(45) Date of Patent: Feb. 17, 2009

(54) GLASS LID, AND PACKAGE PROVIDED WITH SUCH A LID, FOR THE ENCAPSULATION OF ELECTRONIC COMPONENTS

(75) Inventor: Armand Bettinelli, Coublevie (FR)

(73) Assignee: Thomson Licensing, Boulogne Billancourt (FR)

( * ) Notice: Subject to any disclaimer, the term of this patent is extended or adjusted under 35 U.S.C. 154(b) by 192 days.

(21) Appl. No.: 11/142,712

(22) Filed: Jun. 1, 2005

(65) Prior Publication Data

US 2006/0289985 A1    Dec. 28, 2006

(30) Foreign Application Priority Data

Jun. 9, 2004    (FR) .................................. 04 51149

(51) Int. Cl.
*H01L 23/12* (2006.01)

(52) U.S. Cl. .............................. 257/704; 257/E33.058; 257/415; 257/416; 257/706; 438/11; 438/50; 359/291

(58) Field of Classification Search ................ 257/704, 257/E33.058, E33.059, 706, 415, 416, 717, 257/779, 712, 692, 690, 659; 438/11, 50, 438/113; 359/291
See application file for complete search history.

(56) References Cited

U.S. PATENT DOCUMENTS

| 4,206,382 | A |   | 6/1980  | DuBois |
| 6,470,594 | B1 |  | 10/2002 | Boroson et al. |
| 6,489,719 | B1 |  | 12/2002 | Young et al. |
| 6,798,133 | B1 | * | 9/2004 | Ambrugger et al. ......... 313/498 |
| 6,998,776 | B2 | * | 2/2006 | Aitken et al. ................ 313/512 |
| 2003/0066311 | A1 | * | 4/2003 | Li et al. ......................... 65/43 |
| 2003/0230976 | A1 |  | 12/2003 | Nishikawa et al. |

FOREIGN PATENT DOCUMENTS

EP    1 411 562 A1    4/2004

OTHER PUBLICATIONS

"Corning 1737 AMLCD Glass Substrates." 2003. Corning, accessed on Jul. 9, 2007. URL: http://www.vinkarola.com/pdf/Corning%20Glass%201737%20Properties.pdf.*

* cited by examiner

*Primary Examiner*—Chris C. Chu
(74) *Attorney, Agent, or Firm*—Joseph J. Laks; Harvey D. Fried; Patricia Verlangieri

(57) ABSTRACT

The encapsulation lid comprises at least two glass layers of different compositions, a first layer called the bottom layer, which is continuous, and at least a second layer, which is discontinuous and designed so as to define cavities or anfractuosities in this lid. Preferably, the glass layers other than the first layer are preferably formed from low-melting-point frits, thereby allowing such lids to be manufactured economically, without recourse to glass machining.

8 Claims, 3 Drawing Sheets

GLASS LID, AND PACKAGE PROVIDED WITH SUCH A LID, FOR THE ENCAPSULATION OF ELECTRONIC COMPONENTS

This application claims the benefit, under 35 U.S.C. § 119 of French Patent Application 0451149, filed Jun. 9, 2004.

BACKGROUND OF THE INVENTION

The invention relates to a glass encapsulation lid intended to be applied to a substrate supporting microelectronic or microelectrooptic components so as to form, with this substrate, a gas-tight package containing the said components.

The invention applies most particularly to an image-display and/or illumination panel comprising, on a substrate forming the rear face of the panel, at least one organic electroluminescent layer, electrodes for making an electrical current pass through this layer, and the encapsulation lid hermetically sealed onto the substrate so as to form a sealed package enclosing the said organic electroluminescent layer. Such a lid comprises a bottom, forming the front face of the panel, and rims, extending over the entire periphery, which form the sides of the panel and connect the front face to the rear face.

The organic light-emitting diode (OLED) layers are very sensitive to moisture. They therefore have to be encapsulated as soon as they have been manufactured, while these layers are in a controlled atmosphere protected from moisture and from oxygen. The encapsulation must be carried out at low temperature in order not to damage the organic layers that are deposited on a substrate. Usually, the OLED layers are encapsulated by bonding a lid to the substrate, using UV-curable adhesives. Another technique, less common, consists in applying, generally under vacuum, protective layers directly on the organic layers to be protected. It is also possible to use the two techniques simultaneously.

The lid used for the encapsulation may be made of metal or glass. For top-emitting OLEDs, the lid has to be transparent since the light emitted in the electroluminescent layer escapes from the panel on the opposite side to the substrate; such structures are particularly advantageous, especially because they allow high light extraction yields. For such structures, glass lids are therefore generally used.

Document U.S. Pat. No. 6,081,071 discloses an OLED panel provided with a glass substrate and encapsulated by a flat glass lid with no rims. The encapsulation requires the provision of an encapsulated space with a height generally between 0.4 mm and 1 mm between the substrate and the lid. The height of this space is needed for incorporating an adsorbent and/or desiccant agent in the encapsulation space. This adsorbent agent is designed to absorb the residual traces, especially of oxygen and water, in this space. Such an agent is sometimes also called a getter or a desiccating agent.

When a flat lid is used, an adhesive seal serves to establish the distance between the substrate and the lid, which is needed to provide this space, as is also disclosed in document U.S. Pat. No. 6,081,071. The reader may also refer to document US 2003/227253 and especially to FIGS. 5B, 6B and 7 of that document, which describe the use of sealing parts between the lid and the substrate, respectively referenced 512 and 609.

The substrate, the lid and the means for sealing the lid onto the substrate therefore form a gas-tight encapsulation package.

Owing to the very high sensitivity of organic OLED materials to moisture, it is desirable to minimize the thickness of this adhesive seal or the height of this sealing part, which provides the impermeable join between the substrate and the lid. This is because, since this seal or this part is made of an organic material (for example an epoxy resin), it will always be more permeable to moisture and/or oxygen than mineral materials, such as the glass forming the base of the substrate and of the bottom of the lid.

To minimize the thickness of the adhesive seal or the height of the sealing part, packages provided with rims are therefore used. The height of the rim replaces a portion of the height of the seal (see for example FIG. 7 of the abovementioned document U.S. 2003/227253). Such rims form, on the lid, a peripheral projection.

The manufacture of lids provided with rims is expensive. For example, they may be obtained by mechanical machining of a glass plate. This subtractive technique is all the more expensive and ill-suited the larger the size of the panel.

Moreover, it is known to make cavities or grooves in the internal face of the lid in order to be able to better house and distribute the adsorbent agent in the package. FIG. 6B of the abovementioned document U.S. 2003/227253 describes a cavity 608b in the lid 608a, while FIG. 4 of document U.S. 2004/056232 also describes a cavity 49 in the lid 43.

Document U.S. 2003/038590 and EP 1 411 562 also disclose, in the specific case of top-emitting panels, grooves that are made in the internal face of the transparent lid and placed between the pixels, in order to contain adsorbent agent. Documents U.S. Pat. No. 5,239,228 and JP 2002-050471 disclose top-emitting electroluminescent panels in which the transparent lid includes a single peripheral groove which is placed away from the active or emitting surface and which contains an adsorbent agent.

The manufacture of such grooves in glass plates is expensive. For example, they may be obtained by sandblasting, after the regions of the lid corresponding to the locations of the pixels have been masked.

BRIEF SUMMARY OF THE INVENTION

It is an object of the invention is to provide an economic process for manufacturing a glass lid for encapsulating electronic components, especially lids provided with rims and/or cavities and/or grooves.

The subject of the invention is a glass encapsulation lid intended to be applied to a substrate supporting electronic or electrooptic components so as to form, with this substrate, a gas-tight package containing the said components, characterized in that the said lid comprises at least two glass layers of different compositions, a first layer called the bottom layer, which is continuous, and at least a second layer, which is discontinuous and designed so as to define cavities or anfractuosities in the said lid and inside the said package, the said first layer forming the bottom of the said cavities or anfractuosities made in the said second layer.

The second glass layer and, where appropriate, the other layers, apart from the first, are discontinuous, that is to say they have holes or indentations over their entire thickness.

Such a multilayer structure allows the lid to be produced more economically, with no machining, as will be explained in detail below.

Preferably, the softening temperature of the glass of the second layer and, where appropriate, of the other layers, except for the first one, is below the softening temperature of the glass of the first (bottom) layer, thereby making it possible to produce the lid using glass frits for the layers other than the first one. Preferably, this softening temperature does not exceed 550° C. To make it easier to the use the frits, the difference between the softening temperature of the glass of the at least second layer and that of the glass of the bottom layer is preferably greater than 150° C.

Preferably, the first, bottom layer of the lid is plane and of uniform thickness. Such a lid is then particularly suitable for encapsulating flat screens.

The subject of the invention is also a gas-tight package containing electronic or electrooptic components, characterized in that it comprises a substrate supporting the said components and a lid as described above, which lid is joined in a hermetically sealed manner to the said substrate so as to contain the said components and the said cavities or anfractuosities of the lid.

Preferably, the substrate comprises a glass layer supporting the said components, and the composition of this glass is identical to that of the first, bottom layer of the lid. In practice, this glass layer of the substrate is generally a flat support plate. Thanks to the identical composition of the glasses, problems of differential expansion between the two main faces defining the package are avoided.

Preferably, the package includes a seal placed at least around the periphery of the lid and of the substrate, so as to provide the hermetically sealed join and to isolate the components inserted in the package from the gas of the atmosphere. This seal is in general made of a polymer material. Thanks to the invention, it is easy and inexpensive to produce lids provided with a peripheral projection intended to provide the sealed join to the substrate, thereby advantageously making it possible to use very thin seals.

According to a variant, this seal may also serve for isolating the said cavities from each other, so as to avoid any transfer of gas between them.

Preferably, the mean thickness of this seal is less than 100 μm. The small thickness of this seal improves the sealing of the package. Ideally, the thickness of this seal, made of organic material, is between 10 and 20 μm.

Preferably, the components inserted into the package comprise organic light-emitting diodes and/or active matrix circuits.

BRIEF DESCRIPTION OF THE DRAWINGS

The invention will be more clearly understood on reading the description that follows, given by way of non-limiting example and with reference to the appended figures in which.

To simplify the description, identical references will be used for the elements that provide the same functions.

DESCRIPTION OF THE PREFERRED EMBODIMENTS

The invention will be described, with reference to FIG. 1, within the context of the production of an electroluminescent panel provided with a lid according to the invention, the lid being shown here schematically with only four cells.

An active matrix supports a two-dimensional array of organic electroluminescent cells. This active matrix forms a substrate and comprises a flat glass plate on which have been deposited, on the one hand, a silicon layer in which circuits for controlling the electroluminescent cells have been etched and, on the other hand, electrodes for controlling and supplying these circuits and these cells. An electroluminescent cell is deposited on each circuit. Such a substrate supporting these electronic and electrooptic components is obtained using a process known per se.

A process for manufacturing a glass lid according to the invention, intended for encapsulating these components deposited on the substrate, will now be described.

For such a lid, the process starts with a flat glass plate having the same dimensions as the glass plate of the substrate, which will serve as bottom layer. For example, a conventional soda-lime glass, therefore one with a high melting point and a softening point above 550° C., is chosen. Preferably, the same type of glass as that of the base of the active matrix is chosen, especially so as to avoid differential expansion problems.

The aim here is to obtain a lid having grooves or cavities which, after being joined to the substrate, will be placed between the electroluminescent cells, as illustrated for example in document EP 1 411 562 (Thomson).

Figure 1:
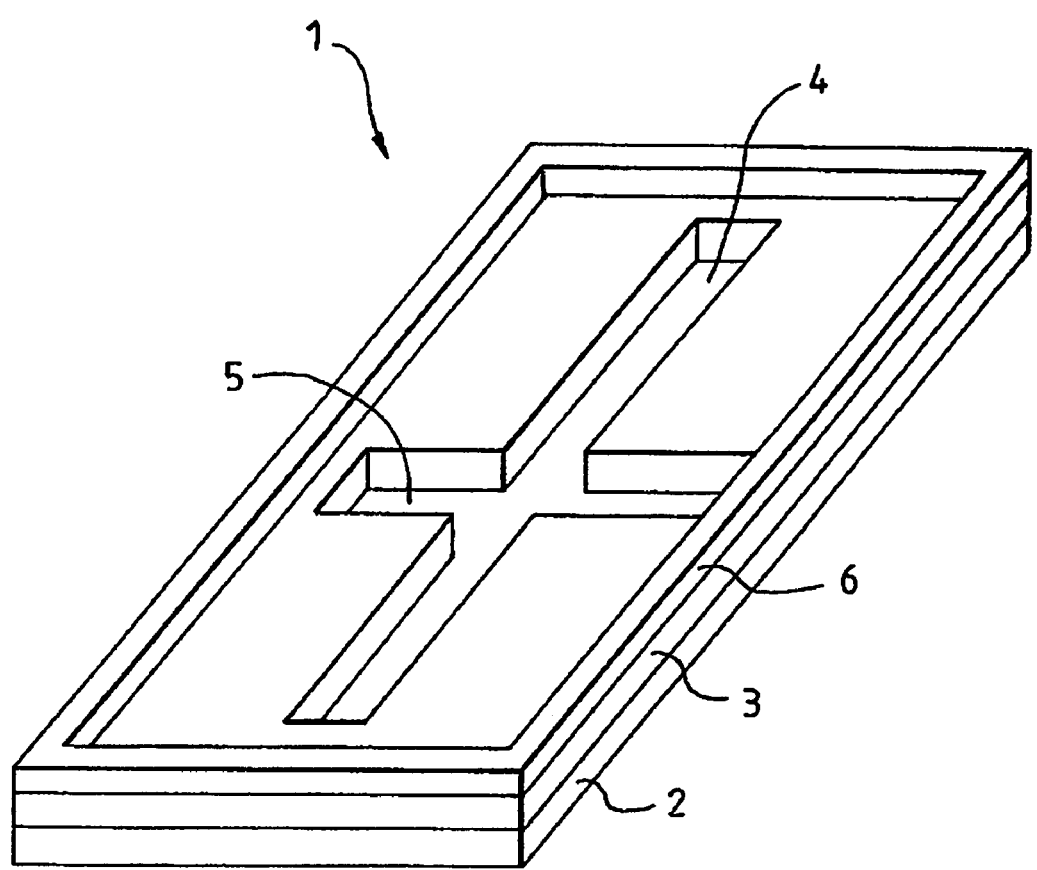
FIG. 1 illustrates a first embodiment of a glass encapsulation lid according to the invention, which comprises three glass layers of different compositions.

FIG. 1 illustrates schematically one embodiment of a lid 1 suitable for the substrate described above.

The flat glass plate forms a bottom layer 2, which is continuous, with no holes, and has here a uniform thickness. It is therefore a very inexpensive part.

A photolithographic paste is prepared in a manner known per se, the said paste comprising a photocurable organic binder dissolved or in suspension in an organic solvent and a mineral glass frit of low melting point. The softening temperature of this frit is substantially below, preferably by at least 150° C., that of the glass of the bottom layer. Preferably, the softening temperature of this frit does not exceed 550° C., or even 450° C. A frit of conventional composition, the firing temperature of which is about 420° C., is selected here. Conventional frits containing borates and/or lead salts may be used. It is also possible to use frits that furthermore contain non-vitreous fillers of high melting point, such as alumina or titanium oxide.

A second layer of uniform thickness of this paste is applied to the bottom layer 2 and the solvent evaporated. By exposure to UV radiation and interposition of a suitable mask, the binder of this layer is cured only at the locations corresponding to the electroluminescent cells. Next, the non-cured regions of this layer are removed, so as to form two perpendicular grooves that will lie between the electroluminescent cells. The bottom of these grooves is formed by the glass plate forming the first, bottom layer 2.

A third layer of uniform thickness of this paste is applied to the second layer and the solvent evaporated.

By interposition of another suitable mask and exposure to UV radiation, the binder of this layer is cured only around the periphery and the entire non-cured central region of this layer is removed so as to form a peripheral projection around the perimeter of the panel, surrounding the four electroluminescent cells. This peripheral projection defines a single cavity, the bottom of which is formed mainly by the previously deposited second layer.

The entire assembly is then fired, generally at about 420° C., so as to remove the organic binders and to consolidate and densify the glass frit of the two paste layers.

A glass lid according to the invention is obtained that comprises a first glass layer or bottom layer 2, which is continuous, a second glass layer 3, which is discontinuous and designed to define grooves 4, 5 between the cells, and a third glass layer 6 forming a continuous peripheral projection around the four cells and defining a cavity extending over the entire active surface of the panel. The first layer 2 forms the bottom of the grooves 4, 5 and the second layer 3 forms mainly the bottom of a single central cavity corresponding to all the cells of the panel. The softening temperature of the glass of the second and third layers is substantially below that of the glass of the first, bottom layer.

This glass lid is advantageously obtained without machining. It is therefore particularly inexpensive.

An adsorbent and desiccant agent known per se is placed in the grooves 4, 5 in order to better guarantee that the electroluminescent cells are protected against the risk of deterioration by oxygen or water vapour An adhesive seal is applied, in a manner known per se, to the top of the peripheral projection that forms the third layer 6, and the glass lid is joined onto the substrate so as to form a gas-tight encapsulation package containing the electronic and electrooptic components supported by the substrate. The seal, which is placed around the periphery of the lid and of the substrate, therefore isolates the cavities formed by the grooves 4, 5 and the central cavity defined by the peripheral projection of the third layer 6 from the gases of the atmosphere.

An OLED panel is thus obtained in which the organic electroluminescent cells are very well isolated from the atmosphere, and all the better since, thanks to the peripheral projection, it is possible to use an adhesive seal of very small mean thickness, preferably less than or equal to 20 μm; this panel therefore has a long lifetime.

Figure 2:
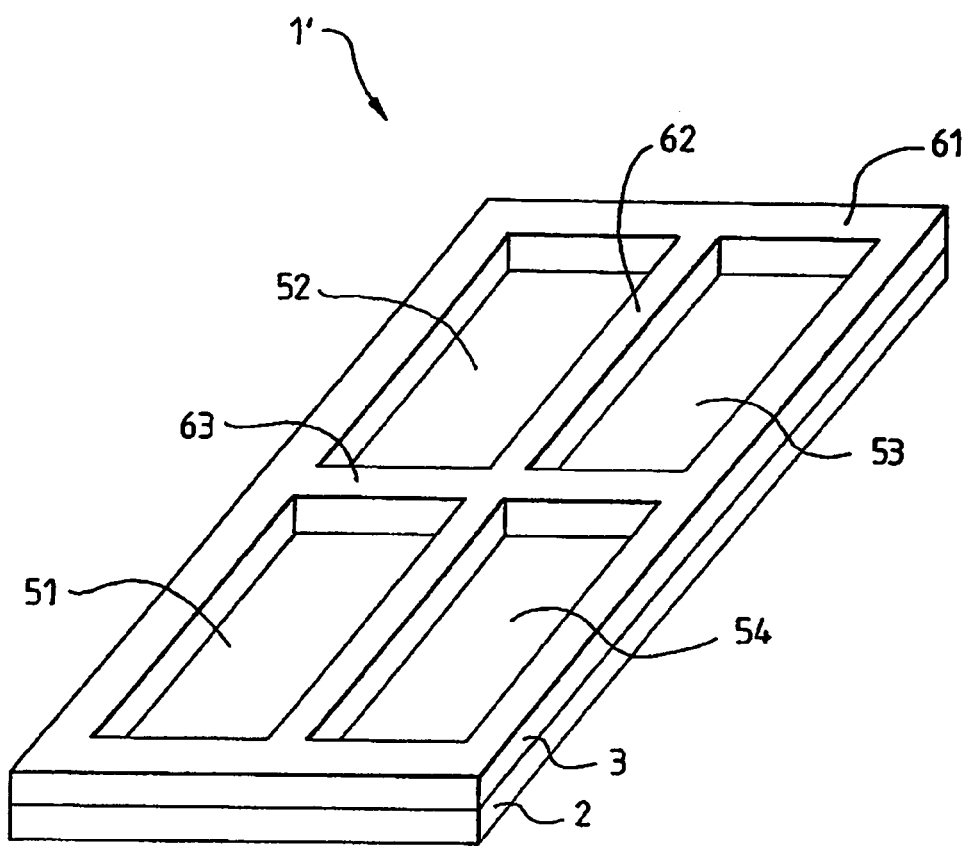
FIG. 2 illustrates a second embodiment of a lid according to the invention, comprising two glass layers of different compositions.
Figure 3:
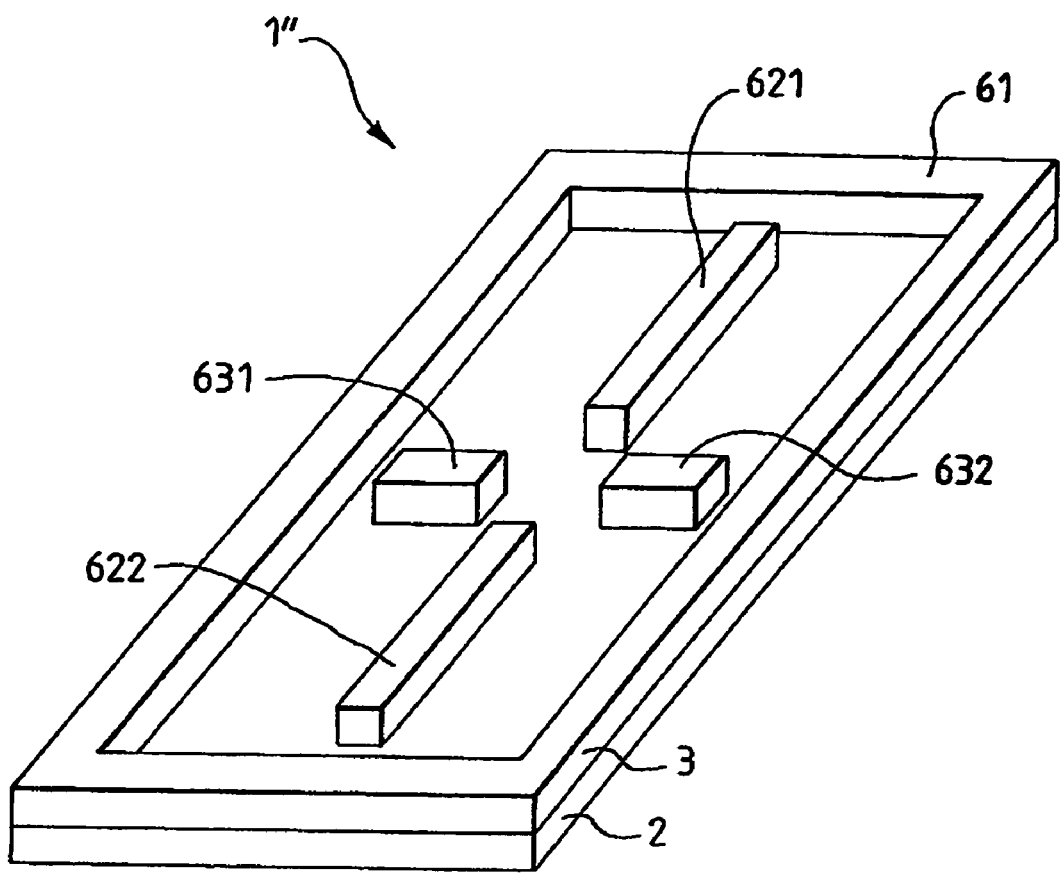
FIG. 3 illustrates a third embodiment of a lid according to the invention.

FIGS. 2 and 3 show other embodiments of a glass encapsulation lid according to the invention that can be obtained by the same photolithographic process described above;

FIG. 2 shows a glass lid 1' comprising a first glass layer or bottom layer 2, which is continuous, a second glass layer 3 of different composition, which is discontinuous and designed to define cavities 51, 52, 53, 54 by means of a peripheral glass projection 61, and two perpendicular glass bars 62 and 63. The first layer 2 forms the bottom of the cavities 51, 52, 53, 54;

FIG. 3 shows a glass lid 1" comprising a first glass layer or bottom layer 2, which is continuous, a second glass layer 3 of different composition, which is discontinuous and designed to form a peripheral glass projection 61, and raised blocks 621, 622, 631 and 632. The peripheral projection 61 defines a cavity, the bottom of which is formed by the first layer 2 while the blocks 621, 622, 631 and 632 provide, between them, anfractuosities or recesses, the bottom of which is formed by the first layer 2.

Other types of glass encapsulation lids may be produced without departing from the invention.

As an alternative process for obtaining the frit paste layers, it is possible to use:

after a uniform frit paste layer has been deposited as previously, the etching of this layer by sandblasting so as to form the cavities or anfractuosities;

direct deposition by screen printing, which allows deposition only at the locations between the cavities, and dispenses with the removal step of the photolithographic process or the etching step of the previous process; and syringe dispensing preferably followed by a planarization step, before or after firing.

Other processes may also be used without departing from the invention.

The invention applies most particularly to the encapsulation of organic electroluminescent panels because the organic compounds of these panels require very effective isolation from the gases of the atmosphere and because these lids provide optimum encapsulation effectiveness. Such panels, known per se, are used for example for illumination or displaying images.

The invention may also apply to the encapsulation of other electronic or electrooptic components.

The invention claimed is:

1. Gas-tight package containing electronic or electrooptic components, comprising a substrate supporting the said components, a glass encapsulation lid applied to the substrate supporting the electronic or electrooptic components, and a seal placed at least around the periphery of the glass encapsulation lid and of the said substrate, so as to hermetically join the glass encapsulation lid to the substrate and to isolate the said components from the gas of the atmosphere, wherein the said lid comprises at least two glass layers of different compositions, a first layer called the bottom layer, which is continuous, and at least a second layer, which is discontinuous and designed so as to define cavities or anfractuosities in the said lid and inside the said package, designed also to form a peripheral glass projection, the said first layer forming the bottom of the said cavities or anfractuosities made in the said second layer, and wherein the said seal is applied to a top surface of the peripheral projection, and is made of an organic material and has a mean thickness less than 100 μm.

2. Gas-tight package according to claim 1, wherein the softening temperature of the glass of the at least second layer is below the softening temperature of the glass of the said bottom layer.

3. Gas-tight package according to claim 2, wherein the softening temperature of the at least second layer does not exceed 550° C.

4. Gas-tight package according to claim 1, wherein the said first layer is plane and of uniform thickness.

5. Gas-tight package according to claim 1, wherein the said substrate is made of glass and wherein the composition of this glass is identical to that of the said first, bottom layer of the said lid.

6. Gas-tight package according to claim 1, wherein the said electronic or electrooptic components comprise organic light-emitting diodes.

7. Gas-tight package according to claim 1, wherein the said electronic or electrooptic components comprise active matrix circuits.

8. Gas-tight package according to claim 1 wherein the mean thickness of the seal is between 10 μm and 20 μm.

\* \* \* \* \*